United States Patent [19]

Hughes

[11] Patent Number: 5,012,133
[45] Date of Patent: Apr. 30, 1991

[54] CIRCUIT ARRANGEMENT FOR PROCESSING SAMPLED ANALOG ELECTRICAL SIGNALS

[75] Inventor: John B. Hughes, Sussex, England

[73] Assignee: U. S. Philips Corporation, New York, N.Y.

[21] Appl. No.: 479,502

[22] Filed: Feb. 13, 1990

[30] Foreign Application Priority Data

Feb. 17, 1989 [GB] United Kingdom ................ 8903704

[51] Int. Cl.$^5$ ................................................ G05F 3/24
[52] U.S. Cl. ................................ 307/352; 307/353; 323/311; 323/312; 323/315; 323/316; 323/317
[58] Field of Search ................ 307/352, 353; 323/311, 323/312, 315, 316, 317

[56] References Cited

U.S. PATENT DOCUMENTS

| | | | |
|---|---|---|---|
| 4,864,217 | 9/1989 | Bird | 323/316 |
| 4,866,368 | 9/1989 | Bird | 323/316 |
| 4,897,596 | 1/1990 | Hughes et al. | 323/315 |

Primary Examiner—Stanley D. Miller
Assistant Examiner—Scott A. Ouellette
Attorney, Agent, or Firm—Bernard Franzblau

[57] ABSTRACT

A circuit for processing sampled analog current signals, includes means for combining, in predetermined proportions, the input sample current in a present sample period with current(s) derived from input sample current(s) in one or more preceding sample periods, and apparatus for deriving the processed output signal from the combined current produced by the combining means in successive sample periods. The circuit consists of a plurality of circuit modules, for example, scaling, memory, and integrator modules, each of which may be capable only of processing unidirectional currents. In order to provide easy interconnection of the modules, each module is arranged to receive and deliver bidirectional currents and to generate internally bias currents to enable conversion from bidirectional to unidirectional currents and vice versa. In order to increase the accuracy of current summing at inputs to the modules, the input circuit of the module is arranged as a current conveyor circuit which has a very low input impedance.

10 Claims, 5 Drawing Sheets

CIRCUIT ARRANGEMENT FOR PROCESSING SAMPLED ANALOG ELECTRICAL SIGNALS

BACKGROUND OF THE INVENTION

This invention relates to a circuit arrangement for processing sampled analog electrical signals.

Our co-pending U.K. patent application Nos. 8721758 (PHB33385) and 8721759 (PHB33386), which correspond to U.S. Pat. Nos. 4,864,217 Sept. 5, 1989 and 4,866,368 Sept. 12, 1989 respectively, disclose a method of processing sampled analog electrical signals in which the electrical quantity manipulated is current. This method is referred to hereinafter as switched current signal processing and circuit arrangements using this method are referred to as switched current circuits. It is known, in switched capacitor circuits, to manipulate electrical charges to perform signal processing of sampled analog electrical signals. However, in order to manipulate the charges high quality linear capacitors are required and in MOS integrated circuits these are commonly fibricated using two polysilicon layers. The provision of two polysilicon layers is not a standard part of the CMOS processes usually used for LSI and VLSI digital circuits and it therefore makes the provision of circuits combining analog and digital signal processing on a single integrated circuit more difficult.

In addition, the capacitors required for the signal manipulation in switched capacitor circuits occupy a large area, which can be half or more of the total chip area. By using switched current circuits the processing and chip area problems may be mitigated. However, it has been found convenient to use current mirror circuits in the implementation of switched current circuits and at least in the simpler embodiments, these circuits require a unidirectional input current. Consequently if, as is usually the case, there is a requirement to process bidirectional input signals, it is necessary to add a bias current to the bidirectional input current to ensure that a unidirectional input current is available. However, it is then necessary to ensure that the bias current is not itself processed in the same manner as the bidirectional input current since it will then be difficult to separate it from the precessed signal current. This requires additional bias current sources at various positions in the processing circuitry having different current magnitudes. Consequently, error can occur due to the difficulty of producing accurately defined bias currents and, in particular, matching current sources which may be widely separated over the area of an LSI or VLSI chip.

Our copending U.S. application No. 286,600 Dec. 16, 1988, now U.S. Pat. No. 4,958,123, discloses a circuit arrangement for processing sampled analogue electrical signals with each sample being in the form of a current. The circuit arrangement comprises means for combining, in predetermined propertions, the input sample current in a present sample period with current(s) derived from input sample current(s) in one or more preceding sample periods, and means for deriving the processed output signal from the combined current produced by the combining means in successive sample periods. The circuit arrangement preferably is formed by a plurality of circuit modules, each circuit module having a current input for receiving a bidirectional input signal current and a current output for supplying a bidirectional output signal current, means for adding a bias current to the bidirectional input current to produce a unidirectional current for processing by the circuit module, and means for subtracting a suitable scaled bias current from the processed unidirectional current to produce current at the current output of the circuit module.

By constructing the circuit arrangement from a plurality of circuit modules, which can be designed to perform particular functions, such as current storage, current amplification, current addition or subtraction, current inversion, and transferring only signal currents between the circuit modules, large systems can be constructed without requiring accurately matched bias current sources at widely spaced locations on an integrated circuit substrate. Thus, a complex signal processing arrangement can be implemented using comparatively simple building block modules in which each module is capable of receiving and producing bidirectional currents even though within the module only unidirectional currents can be handled.

One of the circuit modules disclosed comprises a current memory module which is capable of reproducing at its output in one sampling period a scaled version of the current applied to its input in a previous sampling period.

In order to process signals in switched current circuits it is necessary to be able to store currents from one sampling period to the next so that sample currents occurring in different sample periods can be combined in a desired manner to perform a given signal processing function.

A current memory module disclosed in our copending U.S. application No. 286,600, now U.S. Pat. No. 4,958,123 Sept. 18, 1990, comprises a current input, a current output, first and second switches controlled by first and second non-overlapping clock signals, and first and second memory cells, wherein the current input is coupled to the first memory cell by means fo the first switch and the first memory cell is coupled to the second memory cell be means of the second switch. The output of the second memory cell is coupled to the current output. Each memory cell comprises a field effect transistor, having a capacitor connected between its gate and source electrodes, which forms an output branch of a current mirror circuit. The first and second switches are arranged to isolate the input and output branches of the current mirror circuits, the output branch of the first current mirror circuit being connected to the input branch of the second current mirror circuit. By storing a charge on a capacitor which causes the gate-source potential of the field effect transistor to be maintained when the driving source is removed, the current produced through the transistor by the driving source can be maintained by the charge on the capacitor. Of course, the effectiveness of the current maintenance depends on the input resistance of the transistor and the period during which the current is to be maintained. Consequently, this is one factor which limits the maximum sampling period.

Forming the current memory cells as current mirror circuits having their input and output branches isolated by a switch enables the input current to be accurately produced at the output and enables the capacitor to be charged to the correct potential to maintain the output current at the desired value.

A further circuit module disclosed in U.S. Pat. No. 4,958,123 is an integrator circuit module which is capable of integrating a bidirectional current applied to its input. The integrator circuit module comprises a current memory module and a feedback loop between a stored current output and a summing arrangement so that a stored current can be added to each current input sample. The integrator module may be arranged to perform either lossy or lossless integration, for example, by appropriately chossing the current ratios of current mirror circuits forming or associated with the current memory cells. The integrator modules are useful in forming various filter sections which may be used to construct filters of any desired complexity.

Another circuit module which is disclosed in the aforesaid U.S. patent is a static module which is capable of producing at its output a scaled version of the current applied to its input. The static module may have a plurality of inputs by means of which a plurality of input currents may be applied to the static module to enable current addition or subtraction to be performed by the static module. The static module may perform a current inversion between, its input(s) and output(s).

The static modules allow functions of current gain, signal inversion, current addition, current subtraction, and 'fan-out' to be performed.

One static module comprises a current scaling curcuit, the current scaling circuit comprising means for applying an input current to the input branch of a first current mirror circuit, means for applying a bias current to the input branch of the first current mirror circuit, means for feeding the current from the output branch of the first current mirror circuit to the input branch of a second current mirror circuit, means for feeding the current from the output branch of the second current mirror circuit to the output of the static module, and means for substracting a bias current so that the output current produced by the scaling circuit is a scaled version of the input current applied to the input of the scaling circuit.

Since the static module has its input connected to the input branch of a current mirror circuit, which input branch is commonly formed by a diode connected transistor, it is necessary to ensure that when that is so the current flows in the current conducting direction of the diode. The provision of a bias current which is added to the input current enables this condition to be achieved for values of input current within the designed range. It would be possible, if a current inversion were desired, to take the output from the output branch of the first current mirror circuit and subtract the bias current, or a multiplied version of the bias current if the first current mirror has a current multiplication factor, from the current in the output branch of the first current mirror circuit to produce the required output current of the static module.

In one embodiment the means for applying a bias current to the input branch of the first current mirror circuit may comprise a first current source and means for adding the current produced by the first current source to the input current, and the means for subtracting a bias current may comprise a second current source and a current summing junction to which the output current from the second current source and the output current from the output branch of the second current mirror are applied with appropriate polarity. The scaled output current is derived from the summing junction. The second current mirror circuit may have a plurality of outputs, the static module having a corresponding plurality of outputs, each output of the second current mirror circuit being coupled to a corresponding output of the static module. The means for subtracting the suitably scaled bias current may comprise a bias current source connected to the input of a further current mirror circuit having a number of outputs corresponding to the number of outputs of the second current mirror circuit, the output current(s) produced by the further current mirror circuit being substracted from the corresponding output current(s) of the second current mirror circuit. The static module may be arranged to produce at its output an inversion of the current applied to its input, the input of the static module being coupled to the input of the further current mirror circuit instead of to the input of the first current mirror circuit.

In a further embodiment the static module is arranged to subtract a first current from a second current and to have a first input for application of the second current which is coupled to the input of the first current mirror circuit, a second input for application of the first current which is coupled to the input of the further current mirror circuit, and one or more outputs which are coupled to respective output branches of the second current mirror circuit.

Further embodiments disclosed a static module which is arranged to process a differential input current and produce a differential output current. Such a static module comprises first and second inputs for receiving a differential input current, first and second outputs for producing a differential output current, means for coupling the first input to a first input of a first current summing means, means for coupling a first bias current source to a second input of the first current summing means, means for coupling the output of the first current summing means to the input branch of a first current mirror first input of a second current summing means, means for coupling a second bias current source to a second input of the second current summing means, means for coupling the output of the second current summing means to the input branch of a second current mirror circuit, means for coupling a first output branch of the first current mirror circuit to the input branch of a third current mirror circuit, means for coupling a first output branch of the second current mirror circuit to the input branch of a fourth current mirror circuit, means for coupling a second output branch of the first current mirror circuit to a first input of a third current summing means, means for coupling an output branch of the fourth current mirror circuit to a second input of the third current summing means, means for coupling the output of the third current summing means to the first output, means for coupling a second branch of the second current mirror circuit to a first input of a fourth current summing means, means for coupling an output branch of the third current mirror circuit to a second input of the fourth current summing means, and means for coupling the output of the fourth summing means to the second output.

The static module can be provided with a number of further differential outputs wherein each of the current mirror circuits has a corresponding number of further output branches each of which is connected to appropriate further summing nodes. The static module may also be provided with a number of further differential inputs, each further differential input being connected to a further input of the first and second summing nodes.

Our copending U.S. application No. 446,518 Dec. 4, 1989 discloses a bilinear integrator using switched current signal processing and can be used as a module in switched current circuits having the capability of accepting a bidirectional input current and producing a bidirectional output current. The bilinear integrator disclosed in constructed from current memory modules and static modules such as those disclosed in U.S. Pat No. 4,958,123.

Our copending U.S. application No. 446,821 Dec. 6, 1989 discloses circuit modules equivalent in function to those disclosed in U.S. Pat. No. 4,958,123 and U.S. application No. 446,518 in which the transistors which pass signal currents are all of the same polarity and enable a minimum supply voltage to be utilized.

The circuit modules disclosed in these copending applications all use current mirror circuits for current scaling and a modified current mirror circuit to enable the storage of currents. When a plurality of currents are summed into a node the mismatch between the input impedance of the input of current mirror circuits receiving the summed currents and the combined output impedances of the current mirror circuits providing the currents to be summed is not great enough to allow the current summing to take place with a high degree of accuracy.

SUMMARY OF THE INVENTION

It is an object of the invention to enable a higher mismatch of input and output impedances of the current receiving and current providing circuits.

The invention provides a circuit arrangement for processing sampled analog electrical signals, each sample being in the form of a current. The circuit arrangement comprises means for combining, in predetermined proportions, the input sample current in a present sample period with current(s) derived from input sample current(s) in one or more preceding sample periods, and means for deriving the precessed output signal from the combined current produced by the combining means in successive sample periods; wherein the combining means comprises a current summing node connected to an input of a current conveyor circuit.

The invention further provides a circuit arrangement for processing sampled analogue electrical signals, each sample being in the form of a current, the circuit arrangement comprising means for combining, in predetermined proportions, the input sample current in a present sample period with current(s) derived from input sample current(s) in one or more preceding sample periods, and means for deriving the processed output signal from the combined current produced by the combining means in successive sample periods; wherein the circuit arrangement further comprises a plurality of circuit modules, each circuit module having a current input for receiving a bidirectional input signal current and a current output for supplying a bidirectional output signal current, means for adding a bias current to the bidirectional input current to produce a unidirectional current for processing by the circuit module, and means for subtracting a suitably scaled bias current from the processed unidirectional current to produce a bidirectional current at the current output of the circuit module, and in which in at least one of the circuit modules the current input comprises a current conveyor circuit.

Current conveyor circuits are circuits in which current is conveyed between two ports at greatly different impedance levels. The current conveyor is a three port network with three ports which can be denoted x, y, and z. Its terminal characteristics can be represented by a hybrid matrix giving the outputs of the three ports in terms of their corresponding inputs. For a first generation current conveyor (CCI), this relationship is:

$$\begin{pmatrix} i_y \\ v_x \\ i_z \end{pmatrix} = \begin{pmatrix} 0 & 1 & 0 \\ 1 & 0 & 0 \\ 0 & \pm 1 & 0 \end{pmatrix} \begin{pmatrix} v_y \\ i_x \\ v_z \end{pmatrix}$$

For a second generation current conveyor (CC2) this relationship is:

$$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}$$

Further information concerning current conveyors and their inplementation can be obtained by reference to the paper entitled "Current Conveyor: A review of the State of the Art" by Umesh Kumar, published in IEEE Circuits and Systems Magazine Vol. 3, No. 1, 1981, pages 10 to 14 and in the references cited therein. As discussed in that publication, the transfer characteristic between ports x and z is that of a current controlled current source with a virtual short circuit at input x. The output impedance at port z can be made very high by techniques such as cascoding, thus giving a large difference between input and output impedances. The very low (virtual short circuit) input impedance allows a more accurate current summing when the input to the current conveyor forms the summing node.

The current conveyor circuit may be a three port network whose terminal characteristics can be represented by a hybrid matrix giving the outputs of the three ports (x,y,z) in terms of their corresponding inputs, the hybrid matrix being $$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}$$

This is a second generation current conveyor and has the advantage that no input current is drawn from the reference voltage source thus reducing the demands on the reference voltage source.

The current conveyor may comprise a first transistor whose main current conducting path is connected between the input and a second diode connected transistor whose other end is connected to a voltage supply, a third transistor whose main current carrying path is connected between the voltage supply a fourth diode connected transistor whose other end is connected to an input terminal for the application of a reference potential, and a fifth transistor whose control electrode is connected to the control electrodes of the second and third transistors and whose main current conducting path is connected between the supply voltage and the output, wherein the control electrodes of the first and fourth transistors are commoned and means are provided for internally generating a cancelling current for cancelling the current through the fourth transistor so that no current is drawn through the input terminal.

The means for internally generating the cancelling current comprises a sixth transistor whose control electrode is connected to the control electrode of the second transistor and which is connected to produce the cancelling current and means for feeding the cancelling current to the fourth transistor. The means for feeding the cancelling current may comprise a current mirror circuit. This provides a convenient implementation of a second generation current conveyor circuit.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
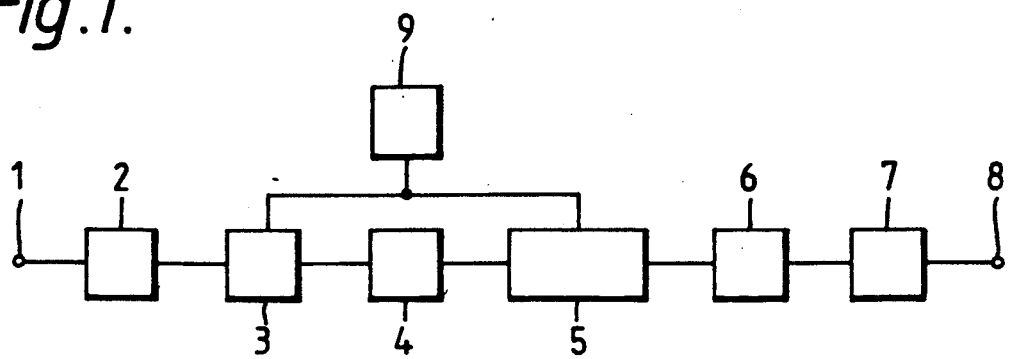
FIG. 1 shows in block schematic form a circuit arrangement for processing sampled analog electrical signals according to the invention.

FIG. 1 shows a circuit arrangement for processing sampled analogue electrical signals in which the invention is included. The circuit arrangement shown has an input 1 which is fed to a low pass filter 2 which acts as an anti-alias filter. If the signal is naturally band limited the filter 2 may be omitted. The output of the filter 2 is fed to the input of a sample and hold circuit 3 to produce a sampled input which is fed to a voltage to current converter 4. The output of the voltage to current converter produces a sampled current output which is fed to a signal processing circuit 5. The output of signal processing circuit 5 is fed to a current to voltage converter 6 whose output is passed through a low pass filter 7 to the output 8 of the arrangement. A clock signal is fed from a clock generator 9 to the sample and hold circuit 3 and to the signal processing circuit 5. If the system was such that the input signal at input 1 was in the form of a current rather than a voltage, the voltage-to-current converter 4 would be omitted. Similarly if the output signal at output 8 was required to be a current output then the current to voltage converter 6 would be omitted. The sample and hold circuit 3 could be after the voltage-to-current converter if it is implemented as a current memory circuit.

The signal processing circuit 5 is arranged to manipulate sampled currents to produce the desired output signal. The precise form of the signal processing circuit 5 will depend on the signal manipulation to be performed. It may, for example, comprise one or more integrator circuits. The signal manipulation is carried out by combining in desired portions the electrical current in a present sample period with the electrical currents in one or more preceding sample periods. Consequently, the signal processing circuit 5 must be capable of making available the currents from at least the preceding sample period. This does not however, mean that the input current in the preceding sample period has itself to be available but merely that the manipulated current produced during the pervious sample period is available together with the current in the present sample period. Typical circuit elements required to perform the manipulation of current samples are current mirror circuits and a current memory. Furthermore in the majority of applications the electrical signal is a voltage rather than a current and hence it is necessary to provide a voltage to current converter and a corresponding current to voltage converter.

In order to perform the signal processing once the signal has been converted to a sampled current, certain basic modules, for example, static modules, memory modules and integrator modules in various combinations dependent on the signal manipulation to be carried out, can be used to form the signal processing arrangements. These modules may be built up from current mirror circuits and for simplicity in describing the static and memory modules a basic current mirror circuit will be shown. However, better performance may be achieved using combinations of alternative current mirrors. In orde to provide a higher accuracy of current summing accuracy, the modules include current conveyor circuits at the inputs of the modules and preferably also within the modules where a current summing function is performed internally, for example, to produce an integration function.

The static modules may have a variety of forms to provide for addition, subtraction, or multiplication of currents or to provide a "fan-out" or plurality of output currents. Similarly, the current memory modules may include a current multiplication and fan-out capability and may include a feedback connection to perform a current addition or subtraction, or an integration function. Additionally the modules may have single ended or differential inputs and outputs.

Each of the modules provided in the signal processing arrangement 5 is arranged to be capable of accepting a bidirectional current input and producing a bidirectional current output. Since the input to a module may be connected to a diode it is necessary to convert the bidirectional input current to a unidirectional input current. This is achieved by adding a bias current, which is generated within the module, to the input current. To obtain a bidirectional output current, a further bias current, which is also generated within the module, is subtracted from the output current. By this means only signal currents are passed between the modules and the bias currents in one module are independent of and have no effect on the bias currents in the other modules. Thus matching of bias current generators is only necessary within a module which will normally be a compact unit occupying only a small portion within an integrated circuit chip, and hence the processing conditions are unlikely to vary significantly within a module. Consequently, the problems involved in producing matched bias current generators are reduced.

Figure 2:
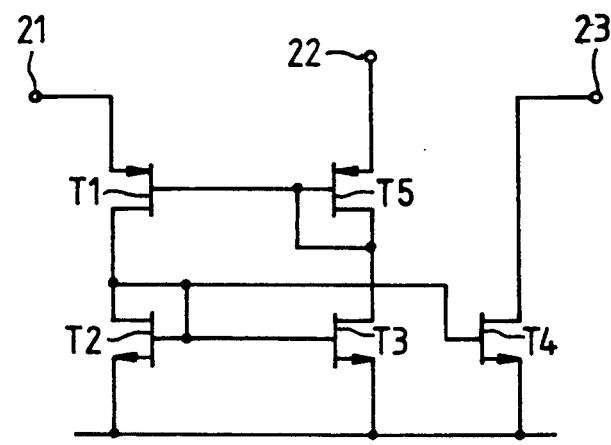
FIG. 2 shows a circuit diagram of a known first generation current conveyor circuit.

FIG. 2 shows a first generation current conveyor circuit having an input 21 which is the x input and which is connected to the source electrode of a p-channel field effect transistor T1. The drain electrode of transistor T1 is connected to the drain and gate electrodes of an n-channel field effect transistor T2 whose source electrode is connected to ground. The gate electrode of transistor T2 is connected to the gate electrodes, of two further n-channel field effect transistors T3 and T4 whose source electrodes are connected to ground. The drain electrode of transistor T3 is connected to the drain and gate electrodes of a p-channel field effect transistor T5 whose source electrode is connected to an input 22 which is the y input. The gate electrode of transistor T5 is connected to the gate electrode of transistor T1 while the drain electrode of transistor T4 is connected to an output 23 which is the z output.

In operation when an input current is applied at input 21 and a bias voltage is applied at terminal 22, an output current will be produced at terminal 23 whose value is proportional to the input current. The proportionality constant being dependent on the dimensions of transistors, T2 and T4. The voltage at terminal 21 will be equal to that applied at therminal 22. It will be seen that the input 22 (y input) will draw current and consequently the voltage source connected to input 22 should ideally be able to provide that current without disturbance of the voltage level at input 22 in order to keep the input voltage at the input 21 (x input) constant.

Figure 3:
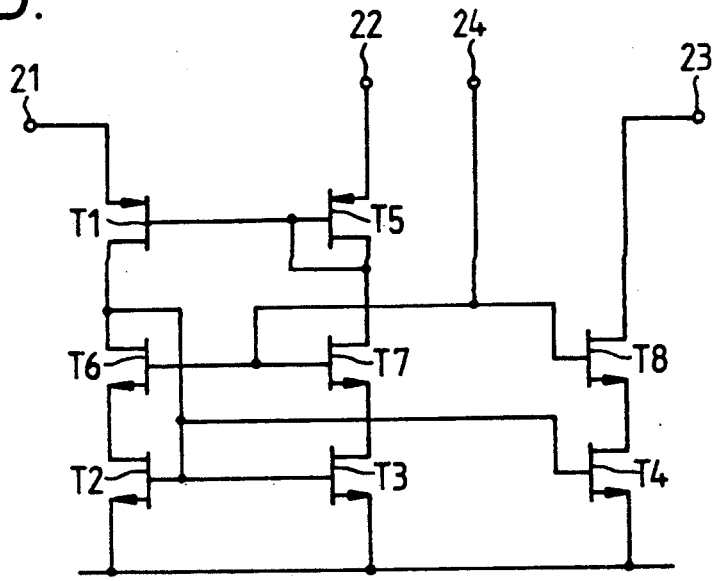
FIG. 3 shows a modification of the current conveyor circuit to provide a higher output impedance.

FIG. 3 is a modified version of the current conveyor circuit shown in FIG. 2. The current conveyor circuit shown in FIG. 3 has a higher output impedance due to the employment of a cascoded current mirror circuit within the current conveyor. This is constructed by the addition of three further n-channel field effect transistors T6, T7 and T8. Transistor T6 has its drain electrode connected to the drain electrode of transistor T1 and to the gate of trnasistor T2, its source electrode connected to the drain electrode of transistor T2, and its gate electrode connected to the gate electrodes of transistors T7 and T8 and to an input terminal 24 which, in operation, is connected to a bias voltage source. The drain electrode of transistor T7 is connected to the drain electrode of transistor T5 while the source electrode of transistor T7 is connected to the drain electrode of transistor T3. The drain electrode of transistor T8 is connected to the output terminal 23 while the source electrode of transistor T8 is connected to the drain electrode of transistor T4.

The cascode connection of the lower current mirror circuit enables a higher output impedance to be obtained at teminal 23. This gives an even greater impedance difference between the current sources, i.e. the z output of the current conveyor, and the input of the next stage, i.e. the x input of the current conveyor. The generation of the bias voltage for the gate electrodes of transistors T6 to T8 can be achieved in known manner, for example as shown in U.S. Pat. No. 4,477,782 or as disclosed in U.S. Pat. No. 4,897,596 Jan. 30, 1990.

Further modifications could be made to increase the performance of the current conveyor circuit if desired. These include the provision of source degeneration resistors to increase the accuracy fo current reproduction in compensating for errors in device geometry, but at the expense of requiring a greater supply voltage, or dynamic element matching as described for current mirror circuits by Rudy van der Plassche in an article intitled "Dynamic Element Matching puts Trimless Converters on Chip" published in "Electronics" dated 16th Jun., 1983. For clarity and ease of description, the current conveyor circuits shown and described hereinafter will be the basic simplified circuit but it will be apparent that, if desired, the more complex higher performance versions could be used.

Figure 4:
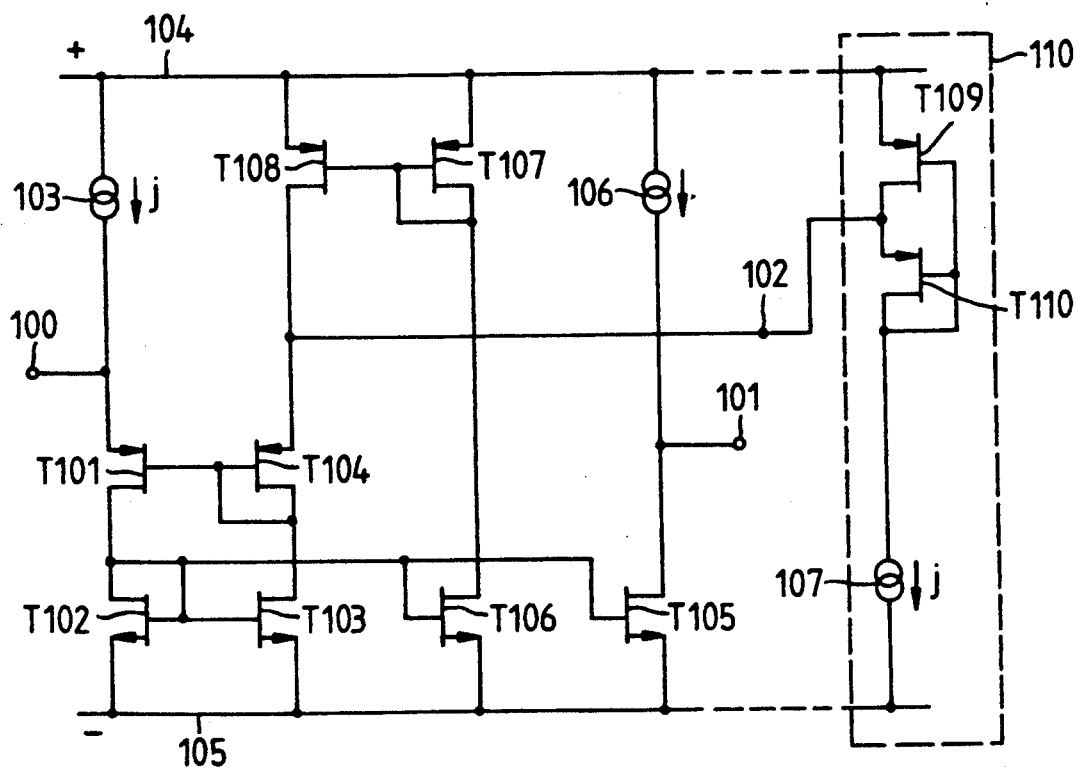
FIG. 4 shows a circuit diagram of a second generation current conveyor circuit.

FIG. 4 shows a current conveyor circuit which performs the second generation current conveying function, i.e. its function is defined by the relationship:

$$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}$$

The current conveyor circuit shown in FIG. 4 has an input 100 which corresponds to the x input, an output 101 which corresponds to the z output, and a terminal 102 which corresponds to the y input. The input 100 is connected to the junction of a current source 103 and the source electrode of a p-channel field effect transistor T101. The other end of the current source 103 is connected to a positive supply rail 104 while the drain electrode of transistor T101 is connected to the drain electrode of an n-channel field effect transistor T102. The source electrode of transistor T102 is connected to a negative supply rail 105 while its drain electrode is connected to its gate electrode and to the gate electrode of a further n-channel field effect transistor T103. The source electrode of transistor T103 is connected to the negative supply rail 105 while its drain electrode is connected to the drain electrode of a p-channel field effect transistor T104 whose source electrode is connected to terminal 102. The gate electrode of transistor T101 is connected to the gate and drain electrodes of transistor T104. Two further n-channel field effect transistor T105 and T106 have their gate electrodes connected to the gate electrode of transistor T102 and their source electrodes connected to the negative supply rail 105. The drain electrode of transistor T105 is connected to the output 101 and via a current source 106 to the positive supply rail 104. The drain electrode of transistor T106 is connected to the drain electrode of a p-channel field effect transistor T107 whose source electrode is connected to the positive supply rail 104. A p-channel field effect transistor T108 has its source electrode connected to the positive supply rail 104, its drain electrode connected to terminal 102 and its gate electrode connected to the gate and drain electrodes of transistor T107. A reference voltage generator 110 comprises a p-channel field effect transistor T109 which has its source electrode connected to the positive supply rail 104 and its drain electrode connected to the source electrode of a p-channel field effect transistor T110. The drain electrode of transistor T110 is connected to the negative supply rail 105 via a current source 107. The gate electrode of transistor T109 is connected to the gate and drain electrodes of transistor T110. The junction of the drain electrode of transistor T109 and the source electrode of transistor T110 is connected to terminal 102 and forms the output of the reference voltage generator 110. The current sources 103, 106 and 107 are arranged to produce a current j which allows an input current i to have the range of approximately ±j without reverse biassing the input diode and a corresponding output current to be produced at output 101.

In operation, if an input current i is applied to input 100 a current of i+j is fed via transistor T101 to the diode connected transistor T102 which, together with transistors T103, T105 and T106 forms a multi-output current mirror circuit. In this embodiment the transistor T102, T103, T105 and T106 are constructed with identical geometries and consequently the current j+i is produced at the drain electrodes of each of the transistors. Scaled currents can be produced by appropriately scaling the transistor geometries. The output current produced by transistor T106 is fed to the input branch of a current mirror circuit formed by transistors T107 and T108 causing the current j+i to be fed to terminal 102. This is the current required by the path comprising transistors T103 and T104 and hence no current flows into or out of terminal 102.

Transistors T109 and T110 and current source 107 form an arrangement for generating a voltage Vdss below that of the positive supply rail 104 by forming transistor T109 such that its channel width/length ratio is one third of that of transistor T110. This gives a maximum voltage availability to the current conveyor circuit in providing that just sufficient voltage is available to enable the current mirror circuit formed by transistors T107 and T108 to operate and allowing the rest of the voltage range to be available at the input terminal 100. The voltage generating arrangement is not an essential part of the current conveyor circuit and may be replaced by any suitable voltage generating arrangement. The provision of the loop formed by transistors T106, T107 and T108 to provide the current which would otherwise be required from the voltage source coupled to terminal 102 converts this circuit to a second generation current conveyor with the input 100 equivalent to the x input, input 102 equivalent to the y input, and output 101 equivalent to the z output.

Any of the modules disclosed in the patents and applications specified hereinbefore can include current conveyors to replace one or more of the current mirror circuits used in the modules disclosed.

Figure 5:
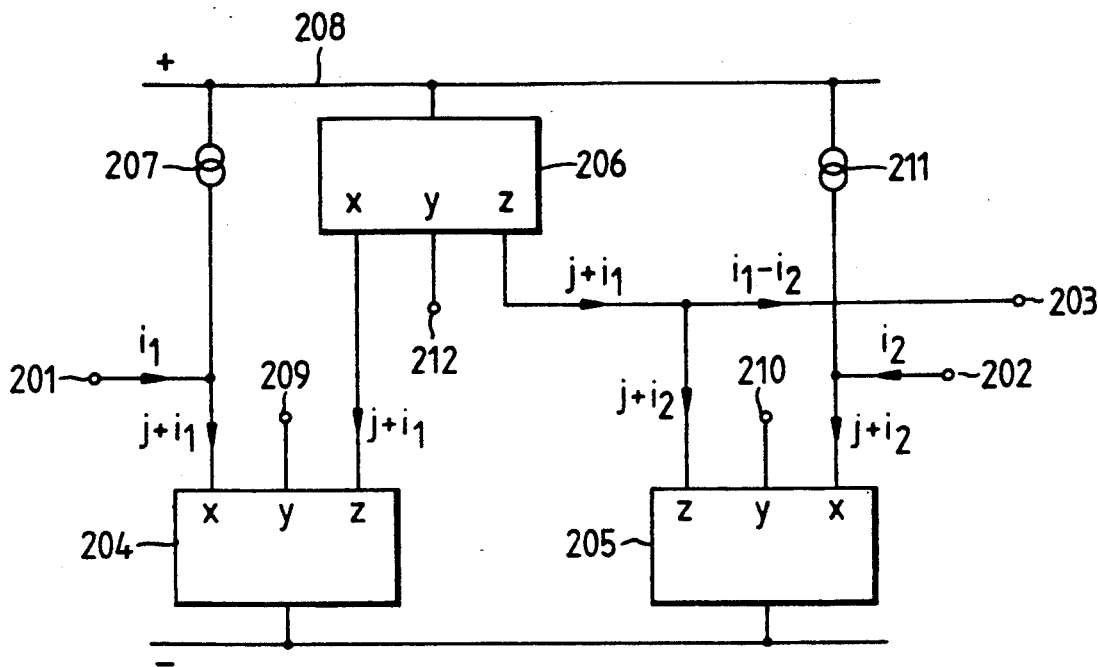
FIG. 5 shows a first embodiment of a circuit module for use in the circuit arrangement of FIG. 1.

FIG. 5 shows a subtracting scaler using current conveyor circuits instead of current mirror circuits. The subtracting scaler shown in FIG. 5 has a first input 201 to which in operation a current $i_1$ is applied, a second input 202 to which in operation a current $i_2$ is applied, and an output 203 from which a current $i_1-i_2$ is derived. The scaling circuit comprises three current conveyor circuits 204, 205 and 206. The first current conveyor 204 has its x input connected to the junction of input 201 and a current source 207 whose other end is connected to a positive supply rail 208. The y inputs of the first and second current conveyors 204 and 205 are connected via terminals 209 and 210 to a bias voltage source $V_{b1}$. The z output of current conveyor 204 is connected to the x input of the current conveyor 206. The second current conveyor 205 has its x input connected to the junction of input 202 and a current source 211 whose other end is connected to the positive supply rail 208. The y input of current conveyor 206 is connected via terminal 212 to a bias voltage source $V_{b2}$. The z outputs of current conveyors 205 and 206 are connected to output 203. The current sources 207 and 211 are each arranged to produce a current j which allows the input currents $i_1$ and $i_2$ to take values in the range $\pm j$.

If currents $i_1$ and $i_2$ are applied to inputs 201 and 202 respectively, then the z output of current conveyor 204 will produce the current $j+i_1$ and the z output of current conveyor 205 will produce the current $j+i_2$. As a result the z output of current conveyor 206 will produce the current $j+i_1$ and the current at output 203 will be $(j+i_1)-(j+i_2)$ which is equal to $i_1-i_2$. If a scaled current subtractor is required, that can be achieved by suitably scaling the transistors in the z output path of current conveyors 204 and 205 with respect to the transistors in the x-input paths of those current conveyors.

Figure 6:
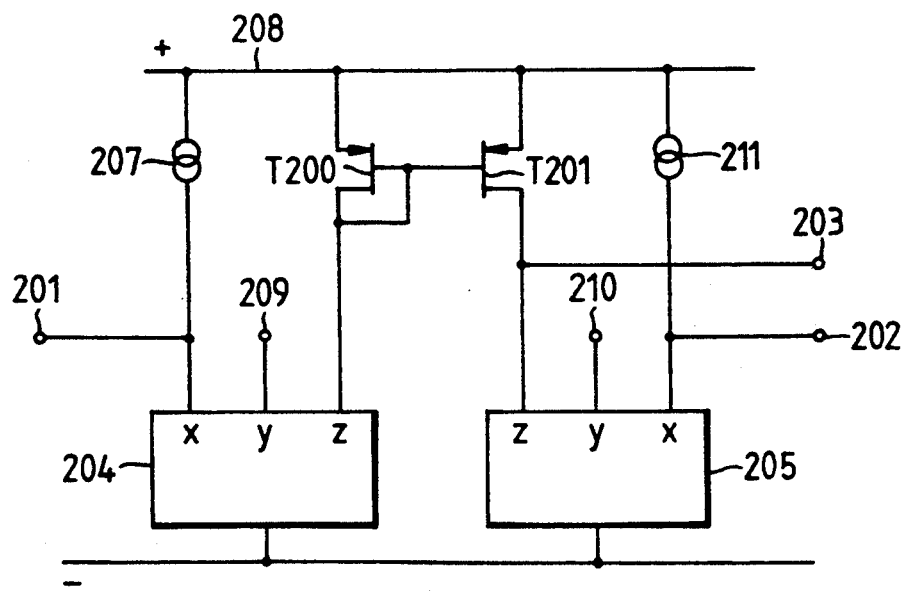
FIG. 6 shows a second embodiment of a circuit module for use in the curcuit arrangement of FIG. 1.

FIG. 6 is a modification of the scaling circuit of FIG. 5 in which the upper current conveyor 206 has been replaced by a current mirror circuit formed by a diode connected p-channel field effect transistor T200 and a second p-channel field effect transistor T201. Since only one current source is connected to the input of the current mirror circuit, its higher input impedance does not cause a significant error. Thus, in practice it may only be necessary or desirable to replace current mirror circuits by current conveyor circuits where a number of currents are summed at the input. When designing standard circuit modules it will normally be desirable to use current conveyor circuits at the module inputs as this is when current summation from a plurality of sources will normally occur. However, this is not necessarily the only place where such current summation occurs as it might well occur within a module such as an integrator module.

A fan-out function can be produced by the modules shown in FIGS. 5 and 6 by providing a plurality of z output paths in current conveyors 205 and 206, each of which may be individually scaled.

Figure 7:
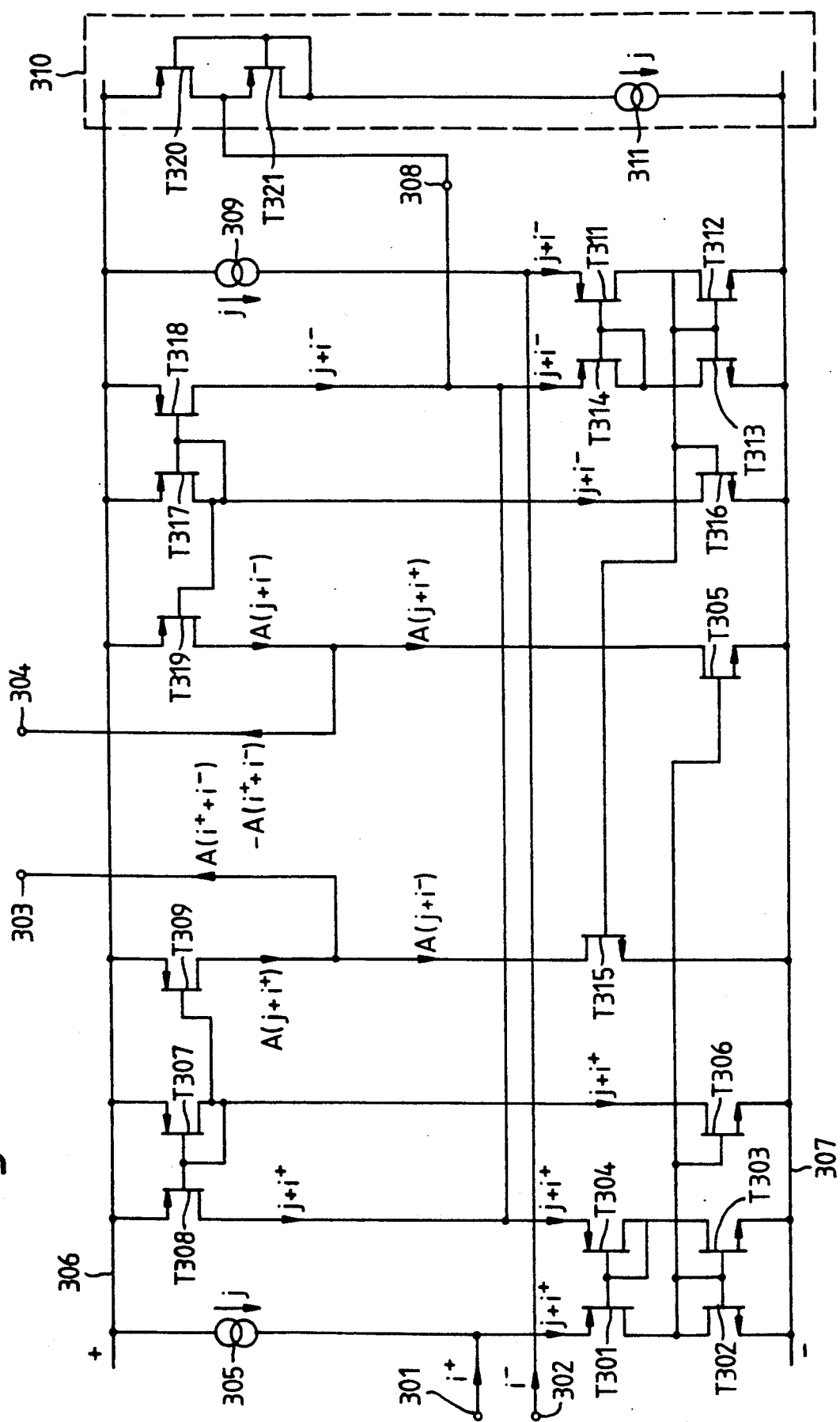
FIG. 7 shows a third embodiment of a circuit module for use in the circuit arrangement of FIG. 1.

FIG. 7 shows a fully differential current scaling module using second generation current conveyor circuits of the form shown in FIG. 4 at the inputs. The module shown has inputs 301 and 302 to which an input signals $i+$ and $i-$ are applied and outputs 303 and 304 at which an output signal $i_o+$ and $i_o-$ are produced. Input 301 is connected to the junction of a current source 305 and the source electrode of a p-channel field effect transistor T301. The other end of current source 305 is connected to a positive supply rail 306 while the drain electrode of tansistor 301 is connected to the drain and gate electrodes of an n-channel field effect transistor T302. The gate electrode of transistor T302 is connected to the gate electrodes of three further n-channel field effect transistors T303, T305 and T306. The source electrodes of transistors T302, T303, T305 and T306 are connected to a negative supply rail 307. The drain electrode of transistor T303 is connected to the drain and gate electrodes of a p-channel field effect transistor T304 and to the gate electrode of transistor T301. The drain electrode of transistor T306 is connected to the drain and gate electrodes of a p-channel field effect transistor T307 whose source electrode is connected to the positive supply rail 306. The gate electrode of transistor T307 is connected to the gate electrodes of two further p-channel field effect transistors T308 and T309 whose source electrodes are connected to the positive supply rail 306. The drain electrodes of transistors T304 and T308 are connected to a terminal 308.

The input 302 is connected to the junction of a current source 309 and the source electrode of a p-channel field effect transistors T311. The other end of the current source 309 is connected to the positive supply rail 306 while the drain electrode of transistor 311 is connected to the drain and gate electrodes of an n-channel field effect transistor T312. The gate electrode of transistor T312 is connected to the gate electrodes of three further n-channel field effect transistors T313, T315 and T316. The source electrodes of transistors T312, T313, T315 and T316 are connected to the negative supply rail 307. The drain electrode of transistor T313 is connected to the drain and gate electrodes of a p-channel field effect transistor T314 and to the gate electrode of transistor T311. The drain electrode of transistor T316 is connected to the drain and gate electrodes of a p-channel field effect transistor T317 whose source electrode is connected to the positive supply rail 306. The gate electrode of transistor T317 is connected to the gate electrodes of two further p-channel field effect transistors T318 and T319 whose source electrodes are connected to the positive supply rail 306. The drain electrodes of transistors T314 and T318 are connected to terminal 308. The drain electrodes of transistors T309 and T315 are connected to output terminal 303 while the drain electrodes of transistors T306 and T319 are connected to output terminal 304.

A bias voltage generator 310 has an output connected to terminal 308 and comprises the series arrangement of first and second p-channel field effect transistors T320 and T321 and a current source 311 between the positive 306 and negative 307 supply rails. The source electrode of transistor 320 is connected to the positive supply rail 306 while is drain electrode is connected to the source electrode of transistor T321 and to the terminal 308. The gate electrode of transistor T320 is connected to the gate and drain electrodes of transistor T321 and to one end of the current source 311.

The current sources 305 and 309 produce a current j to allow bidirectional input currents of $\pm j$ without reverse biassing the input diodes in the current conveyor circuits.

If currents $i^+$ and $i^-$ are fed to inputs 301 and 302, then the current $j+i^+$ is applied to the source electrode of transistor T301 and consequently to the diode connected transistor T302. As a result the current $j+i^+$ is produced at the drain electrodes of transistors T303 and T306 and a current of $A(j+i^+)$ is produced at the drain electrode of transistor T305 if it is assumed that the gate width/length ratios of transistors T302 : T303 : T305 : T306 are 1:1:A:1. On the same assumptions the currents produced at the drain electrodes of transistors T312, T313 and T316 are $j+i^-$ and that at the drain electrode of transistor T315 is $A(j+i^-)$.

The current $j+i^+$ is fed to the input branch of the current mirror circuit formed by transistors T307, T308 and T309. Transistor T309 is constructed to have a gate width/length ratio of A times that of transistors T307 and T308 and hence produces a current $A(j+i^+)$ a its drain electrode while transistor T308 produces a current $j+i^+$ at its drain electrode. Consequently no current flows to terminal 308 as the current $j+i^+$ produced at the drain electrode of transistor T308 flows into the source electrode of transistor T304.

Similarly the current $j+i^-$ is fed to the input branch of the current mirror circuit formed by transistors T317, T318 and T319. Transistor T319 is constructed to have a gate width/length ratio of A times that of transistors T317 and T318 and hence produces a current $A(j+i^-)$ at its drain electrode while transistor T318 produces a current $j+i^-$ at its drain electrode. Consequently no current flows to terminal 308 as the current $j+i^-$ produced at the drain electrode of transistor T318 flows into the source electrode of transistor T314.

The current $A(j+i^+)$ is produced by the transistor T309 while the current $A(j+i^-)$ is conducted by the transistor T315 and as a result the current at terminal 303 is equal to $A(i^+ - i^-)$. Similarly the current $A(j+i^-)$ is produced by transistor T319 while the current $A(j+i^+)$ is absorbed by the transistor T305 and as a result the current $A(i^- - i^+)$ or $A(i^+ - i^-)$ is produced at terminal 304. That is $i_o^+ = A(i^+ - i^-)$ and $i_o^- = -A(i^+ - i^-)$.

It can be seen that neither of the current conveyor circuits produced a net current at its y input, i.e. the point connected to terminal 308 and that therefore they are second generation (or CC2) current conveyors.

In the bias voltage generator the gate width/length ratio of transistor T320 is one third of that of transistor T321 so that the voltage Vdss is produced at terminal 308 enabling the current mirror transistor to be held in the saturated state but giving the maximum voltage headroom for the current conveyor circuits.

Figure 8:
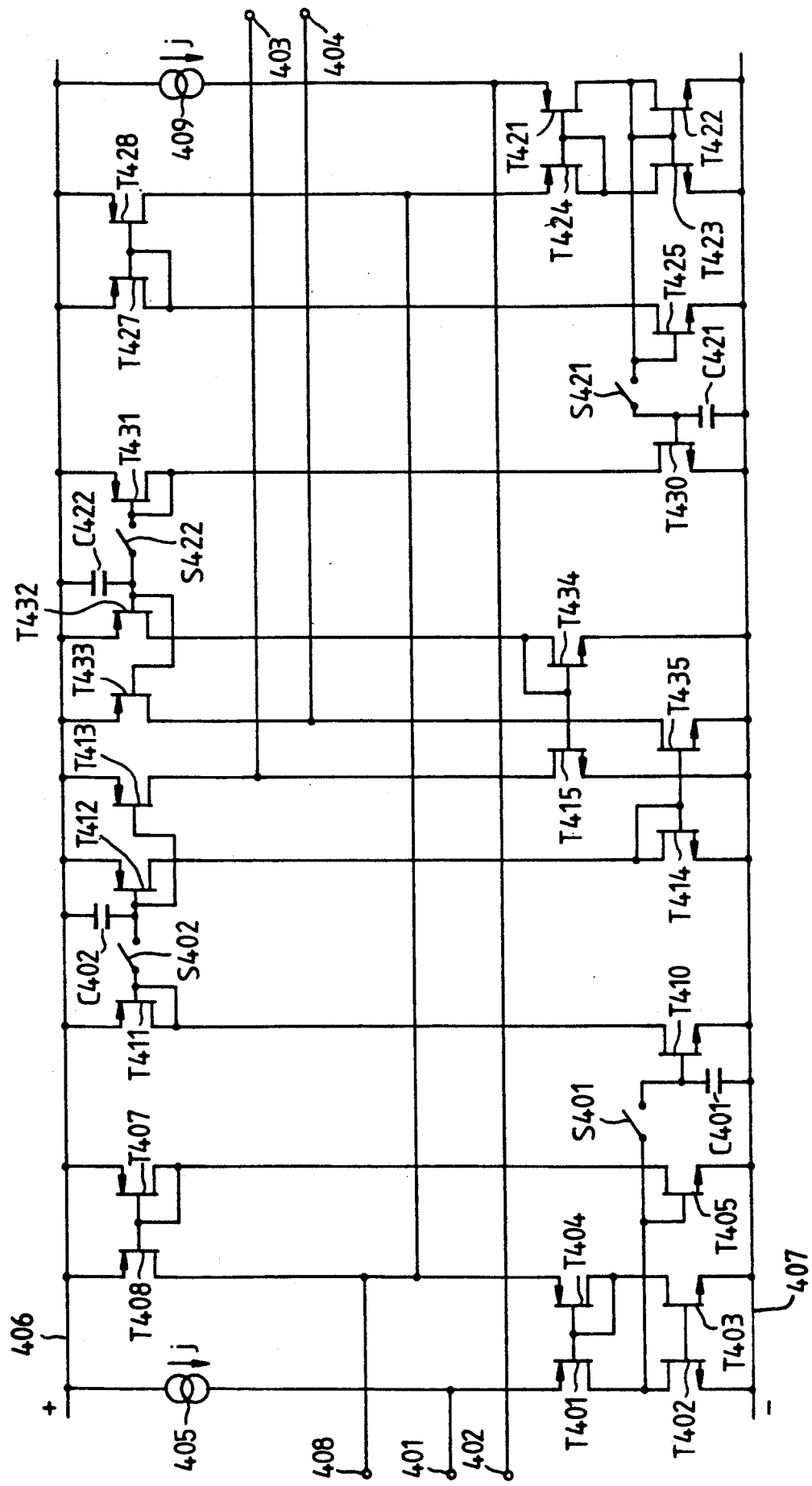
FIG. 8 shows a fourth embodiment of a circuit module for use in the circuit arrangement of FIG. 1.

FIG. 8 shows a fully differential current memory circuit module which has input terminals 401 and 402 for receiving input current $i^+$ and $i^-$ and output terminasl 403 and 404 at which output currents $i_o^+$ and $i_o^-$ are produced. The input terminal 401 is connected to the junction of a current source 405 and the source electrode of a p-channel field effect transistor T401. The other end of the current source 405 is connected to a positive supply rail 406 while the drain electrode of transistor T401 is connected to the drain and gate electrodes of an n-channel field effect transistor T402. The source electrode of transistor T402 is connected to a negative supply rail 407. The gate electrode of transistor T402 is connected to the gate electrodes of two further n-channel field effect transistors T403 and T405 whose source electrodes are connected to the negative supply rail 407. The drain electrode of transistor T403 is connected to the drain and gate electrodes of a p-channel field effect transistor T404 and to the gate electrode of transistor T401. The drain electrode of transistor T405 is connected to the drain and gate electrodes of a p-channel field effect transistor T407 whose source electrode is connected to the positive supply rail 406. The gate electrode of transistor T407 is connected to the gate electrode of a p-channel field effect transistor T408 whose source electrode is connected to the positive supply rail 406 and whose drain electrode is connected to the source electrode of transistor T404 and to a terminal 408. The components thus far described and their interconnections form a current conveyor circuit as shown in FIG. 4. The bias voltage V, which may be generated by the arrangement shown in FIG. 7, is applied at terminal 408.

The gate electrode of transistor T405 is connected to one side of a switch S401 whose other side is connected to the junction of a capacitor C401 and the gate electrode of an n-channel field effect transistor T410. The other end of the capacitor C401 is connected to the negative supply rail 407. The source electrode of transistor T410 is connected to the negative supply rail 407 while its drain electrode is connected to the gate and drain electrodes of a p-channel field effect transistor T411 whose source electrode is connected to the positive supply rail 406. The gate electrode of transistor T411 is connected to its drain and to one side of a switch S402 whose other side is connected to the junction of a capacitor C402 and the gate electrode of a p-channel field effect transistor T412. The other end of the capacitor C402 is connected to the positive supply rail 406. The gate electrode of transistor T412 is connected to the gate electrode of a p-channel field effect transistor T413. The source electrodes of transistors T412 and T413 are connected to the positive supply rail 406. The drain electrode of transistor T412 is connected to the drain and gate electrodes of an n-channel field effect transistor T414 whose source electrode is connected to the negative supply rail 407. The drain electrode of transistor T413 is connected to the output terminal 403 and to the drain electrode of an n-channel field effect transistor T415 whose source electrode is connected to the negative supply rail 407.

The input terminal 402 is connected to the junction of a current source 409 and the source electrode of a p-channel field effect transistor T421. The other end of the current source 409 is connected to a positive supply rail 406 while the drain electrode of transistor T421 is connected to the drain and gate electrodes of an n-channel field effect transistor T422. The source electrode of transistor T422 is connected to a negative supply rail 407. The gate electrode of transistor T422 is connected to the gate electrodes of two further n-channel field effect transistors T423 and T425 whose source electrodes are connected to the negative supply rail 407. The drain electrode of transistor T423 is connected to the drain and gate electrodes of a p-channel field effect transistor T424 and to the gate electrode of transistor T421. The drain electrode of transistor T425 is connected to the drain and gate electrodes of a p-channel field effect transistor T427 whose source electrode is connected to the positive supply rail 406. The gate electrode of transistor T427 is connected to the gate electrode of a p-channel field effect transistor T428 whose source electrode is connected to the positive supply rail 406 and whose drain electrode is connected to the source electrode of transistor T424 and to terminal 408. The components thus far described in this paragraph and their interconnections form a current conveyor circuit as shown in FIG. 4, the bias voltage V, which may be generated by the arrangement shown in FIG. 7, being applied at terminal 408.

The gate electrode of transistor T425 is connected to one side of a switch S421 whose other side is connected to the junction of a capacitor C421 and the gate electrode of an n-channel field effect transistor T430. The other end of the capacitor C421 is connected to the negative supply rail 407. The source electrode of transistor T430 is connected to the negative supply rail 407 while its drain electrode is connected to the gate and drain electrodes of a p-channel field effect transistor T431 whose source electrode is connected to the positive supply rail 406. The gate electrode of transistor T431 is connected to one side of a switch S422 whose other side is connected to the junction of a capacitor C422 and the gate electrode of a p-channel field effect transistor T432. The other end of the capacitor C422 is connected to the positive supply rail 406. The gate electrode of transistor T432 is connected to the gate electrode of a p-channel field effect transistor T433. The source electrodes of transistors T432 and T433 are connected to the positive supply rail 406. The drain electrode of transistor T432 is connected to the drain and gate electrodes of an n-channel field effect transistor T434 whose source electrode is connected to the negative supply rail 407. The drain electrode of transistor T433 is connected to the output terminal 404 and to the drain electrode of an n-channel field effect transistor T435 whose source electrode is connected to the negative supply rail 407. The gate electrode of transistor T414 is connected to the gate electrode of transistor T435 while the gate electrode of transistor T434 is connected to the gate electrode of transistor T415.

The current sources 405 and 409 are each arranged to produce a current j to allow the input currents $i^+$ and $i^-$ applied to inputs 401 and 402 to take values between $\pm j$ without reverse biassing the input diodes in the current conveyor circuits.

Figure 9:
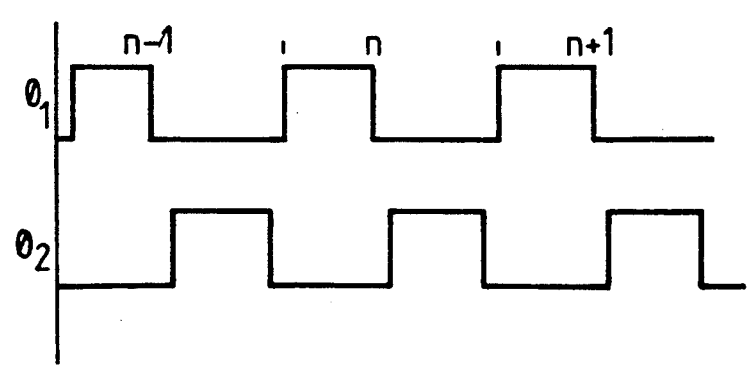
FIG. 9 is a timing diagram for operation of the switches in the embodiment of FIG. 8.

The switches S401 are closed during phase $\phi_2$ of the clock signal shown in FIG. 9 while the switches S402 and S422 are closed during the phase $\phi_1$ of the clock signal shown in FIG. 9. The phases $\phi_1$ and $\phi_2$ are non-overlapping. Transistors T401 to T410 together with the capacitor C401 and switch S401 comprises a current memory cell as disclosed in U.S. Pat. No. 4,866,368 Sept. 12, 1989 in which the current mirror circuit is replaced by a current conveyor circuit. A similar current memory cell is formed by transistors T421 to T430 together with capacitor C421 and switch S421. Transistors T411 and T412 together with capacitor C402 and switch S402 form a current memory cell as disclosed in that patent as do transistors T431 and T432 together with capacitor C422 and switch S422.

In operation, if in time period (n−1) a current $i^+(n-1)$ is applied to input 401 and a current $i^-(n-1)$ is applied to input 402, then on clock phase $\phi_2$ of period (n−1) switches S401 and S421 are closed and transistors T410 and T430 produce the currents $j+i^+(n-1)$ and $i+i^-(n-1)$. The capacitors C401 and C421 are charged to the gate-source potentials of transistors T410 and T430, respectively. At the end of the $\phi_2$ clock phase switches S401 and S421 open but the currents through transistors T410 and T430 are maintained as the required gate-source potential is held on the capacitors C401 and C421. On clock phase $\phi_1$ of period n switches S402 and S422 are closed and transistors T412 and T413 produce the currents $j+i^+(n-1)$ while transistors T432 and T433 produce the currents $j+i^-(n-1)$. At the end of the $\phi_1$ clock phase of period n the switches S402 and S422 open but the currents $j+i^+(n-1)$ through transistors T412 and T413 and $j+i^-(n-1)$ through transistors T432 and T433 are maintained as the appropriate gate-source potentials are held on capacitors C402 and C422, respectively. The current $j+i^-(n-1)$ is passed from transistor T432 to the transistor T434 which forms the input branch of a current mirror circuit whose output branch is the transistor T415. Thus in period n the output at terminal 403 is the current through transistor T413, i.e. $j+i^+(n-1)$, minus the current through transistors T415, i.e. $j+i^-(n-1)$. Consequently the current $i_o^+(n)$ at terminal 403 during period n is equal to $i^+(n-1)-i^-(n-1)$ or $(i^+-i^-)(n-1)$. By a similar process it can be deduced that the current $i_o^-(n)$ at terminal 404 is $-(i^+-i^-)(n-1)$. Thus the arrangement shown in FIG. 7 is capable of reproducing in one clock period a current at its output which is equal to or is related to the current applied to its input in a preceding clock period. It is possible to add a scaling function to the memory function by appropriate scaling of individual transistors and to provide a fan-out function by adding additional output branches to the upper current memory cells and the current mirror circuits.

U.K. which corresponds to U.S. Pat. Nos. 4,897,596 and 4,958,123 and U.S. Applications 446,518 and 446,821 disclose various scaling, memory and integrator modules all of which may have current mirror circuits replaced by current conveyor circuits as proposed herein. The present invention has been described with reference to a limited number of representative modules but it will be apparent to the person skilled in the art that the modules disclosed int hese patents and co-pending applications, the contents of which are hereby incorporated by reference, could all be modified to include current conveyor circuits where desired. The greatest benefit of current conveyor circuits is where a number of outputs are fed to a current summing node where the very low input impedance of the current conveyor circuit minimizes inaccuracies in summing the currents. Typically, the current summing takes place at the input of a module, but it may also take place within a module, particularly where an integration function is being performed.

From reading the present disclosure, other modifications will be apparent to person skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any modifications of one or more of those features which would be obvious to persons skilled in the art, whether or not it relates to the same invention as presently claimed in any claim and whether or not it mitigates any or all of the same technical problems as does the present invention.

I claim:

1. A circuit arrangement for processing sampled analogue electrical signals, each sample being in the form of a current, the circuit arrangement comprising; means for combining, in predetermined proportions, an input sample current in a present sample period with current(s) derived from input sample current(s) in one or more preceding sample periods, and means for deriving a processed output signal from a combined current produced by the combining means in successive sample periods, whrein the combining means comprises a current summing node connected to an input of a current conveyor circuit.

2. A circuit arrangement for processing sampled analogue electrical signals, each sample being in the form of a current, the circuit arrangement comprising; means for combining, in predetermined proportions, an input sample current in a present sample period with current(s) derived from input sample current(s) in one or more preceding sample periods, and means for deriving a processed output signal from a combined current produced by the combining means in successive sample periods; a plurality of circuit modules, each circuit module having a current input for receiving a bi-directional input signal current and a current output for supplying a bi-directional output signal current, means for adding a bias current to the bi-directional input signal current to produce a uni-directional current for processing by the circuit module and means for subtracting a suitably scaled bias current from the processed uni-directional current to produce a bi-directional signal current at the current output of the circuit module, and in which in at least one of the circuit modules the current input comprises a current conveyor circuit.

3. A circuit arrangement as claimed in claim 2 wherein at least one current conveyor circuit is a three port network whose terminal characteristics can be represented by a hybrid matrix giving the outputs of the three ports (x,y,z) in terms of their corresponding inputs, the hybrid matrix being $$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}.$$

4. A circuit arrangement as claimed in claim 3 in which at least one current conveyor circuit comprises a first transistor whose main current conducting path is connected between the input and a second diode connected transistor whose other end is connected to a voltage supply, a third transistor whose main current carrying path is connected between the voltage supply and a fourth diode connected transistor whose other end is connected to an input terminal for the application of a reference potential, and a fifth transistor whose control electrode is connected to control electrodes of the second and third transistors and whose main current conducting path is connected between the supply voltage and the output, where in control electrodes of the first and fourth transistors are commoned, and means for internally generating a cancelling current for cancelling the current through the fourth transistor so that no current is drawn through the input terminal.

5. A circuit as claimed in claim 4 wherein the means for internally generating the cancelling current comprises a sixth transistor whose control electrode is connected to the control electrode of the second transistor and which is connected to produce the cancelling current, and means for feeding the cancelling current to the fourth transistor.

6. A circuit arrangement as claimed in claim 5 wherein the means for feeding the cancelling current comprises a current mirror circuit.

7. A circuit arrangement as claimed in claim 1 wherein at least one current conveyor circuit is a three port network whose terminal characteristics can be represented by a hybrid matrix giving the outputs of the three ports (x,y,z) in terms of their corresponding inputs, the hybrid matrix being $$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}.$$

8. A circuit arrangement as claimed in claim 7 in which at least one current conveyor circuit comprises a first transistor whose main current conducting path is connected betweeen the input and a second diode connected transistor whose other end is connected to a voltage supply, a third transistor whose main current carrying path is connected between the voltage supply and a fourth diode connected transistor whose other end is connected to an input terminal for the application of a reference potential, and a fifth transistor whose control electrode is connected to control electrodes of the second and third transistors and whose main current conducting path is connected between the supply voltage and the output, wherein control electrodes of the first and fourth transistors are commoned, and means for internally generating a cancelling current for cancelling the current through the fourth transistor so that no current is drawn through the input terminal.

9. A circuit as claimed in claim 8 wherein the means for internally generating the cancelling current comprises a sixth transistor whose control electrode is connected to the control electrode of the second transistor and which is connected to produce the cancelling current, and means for feeding the cancelling current to the fourth transistor.

10. A circuit arrangement as claimed in claim 9 wherein the means for feeding the cancelling current comprises a current mirror circuit.

* * * * *